(12) United States Patent
Goto et al.

(10) Patent No.: US 9,224,850 B2
(45) Date of Patent: Dec. 29, 2015

(54) SEMICONDUCTOR DEVICE AND METHOD OF MANUFACTURING THE SAME

(71) Applicant: KABUSHIKI KAISHA TOSHIBA, Minato-Ku, Tokyo (JP)

(72) Inventors: Masakazu Goto, Tsukuba-Shi (JP); Shigeru Kawanaka, Yokohama-Shi (JP); Akira Hokazono, Kawasaki-Shi (JP); Tatsuya Ohguro, Yokohama-Shi (JP); Yoshiyuki Kondo, Yokohama-Shi (JP)

(73) Assignee: KABUSHIKI KAISHA TOSHIBA, Toyko (JP)

( * ) Notice: Subject to any disclaimer, the term of this patent is extended or adjusted under 35 U.S.C. 154(b) by 0 days.

(21) Appl. No.: 13/957,330

(22) Filed: Aug. 1, 2013

(65) Prior Publication Data

US 2014/0291736 A1 Oct. 2, 2014

(30) Foreign Application Priority Data

Apr. 1, 2013 (JP) ................................ 2013-076256

(51) Int. Cl.
*H01L 29/66* (2006.01)
*H01L 29/78* (2006.01)
*H01L 29/739* (2006.01)
*H01L 21/8234* (2006.01)

(52) U.S. Cl.
CPC ........ *H01L 29/78* (2013.01); *H01L 21/823418* (2013.01); *H01L 21/823493* (2013.01); *H01L 29/66356* (2013.01); *H01L 29/66477* (2013.01); *H01L 29/7391* (2013.01)

(58) Field of Classification Search
CPC ................. H01L 29/66477; H01L 21/823418; H01L 21/823493
USPC ................................................ 257/288, E21.4
See application file for complete search history.

(56) References Cited

U.S. PATENT DOCUMENTS

| | | | |
|---|---|---|---|
| 6,174,778 B1 * | 1/2001 | Chen et al. | 438/302 |
| 8,288,813 B2 | 10/2012 | Kakoschke et al. | |
| 2005/0073009 A1 * | 4/2005 | Kojima et al. | 257/362 |

FOREIGN PATENT DOCUMENTS

| | | | |
|---|---|---|---|
| JP | 06-334175 A | 12/1994 | |
| JP | 07-066404 A | 3/1995 | |
| JP | 09-293853 A | 11/1997 | |
| JP | 2006-147805 A | 6/2006 | |
| JP | 2008-311452 A | 12/2008 | |
| JP | 2013-074288 A | 4/2013 | |

* cited by examiner

*Primary Examiner* — Amar Movva
(74) *Attorney, Agent, or Firm* — Holtz, Holtz, Goodman & Chick PC

(57) ABSTRACT

In one embodiment, a first main terminal region of a first conductivity type and a second main terminal region of a second conductivity type, which is an opposite conductivity type of the first conductivity type, formed in the semiconductor substrate so as to sandwich a gate electrode, a diffusion layer of the second conductivity type coming in contact with the first and second element isolation insulator films and having an upper surface in a position deeper than lower surfaces of the first and second main terminal regions, a first well region of the first conductivity type formed between the first main terminal region and the diffusion layer, and a second well region of the first conductivity type formed between the second main terminal region and the diffusion layer. The second well region has a impurity concentration higher than that of the first well region.

10 Claims, 9 Drawing Sheets

SEMICONDUCTOR DEVICE AND METHOD OF MANUFACTURING THE SAME

CROSS REFERENCE TO RELATED APPLICATION

This application is based upon and claims benefit of priority from the Japanese Patent Application No. 2013-76256, filed on Apr. 1, 2013, the entire contents of which are incorporated herein by reference.

FIELD

Embodiments described herein relate generally to a semiconductor device and a method of manufacturing the same.

BACKGROUND

In recent years, a tunnel transistor has been vigorously studied with an aim to achieve higher performance and lower power consumption than a MOSFET. Since the tunnel transistor has a source region and a drain region that are of different conductivity types from each other, a short circuit between a substrate and either the source region or the drain region becomes a problem. Therefore, the tunnel transistor is commonly formed on a semiconductor on insulator (SOI) substrate in order to electrically separate the tunnel transistors from each other. However, since the SOI substrate is more expensive than a bulk semiconductor substrate, a method in which the tunnel transistors can be electrically separated while using the bulk semiconductor substrate is sought after.

DETAILED DESCRIPTION

According to one embodiment, a semiconductor device includes a semiconductor substrate, first and second element isolation insulator films formed inside the semiconductor substrate, a gate electrode formed on the semiconductor substrate between the first and second element isolation insulator films through a gate insulator film, a first main terminal region of a first conductivity type and a second main terminal region of a second conductivity type, which is an opposite conductivity type of the first conductivity type, formed in the semiconductor substrate so as to sandwich the gate electrode, a diffusion layer of the second conductivity type formed in the semiconductor substrate so as to come in contact with the first and second element isolation insulator films and having an upper surface in a position deeper than lower surfaces of the first and second main terminal regions, a first well region of the first conductivity type formed between the first main terminal region and the diffusion layer, and between the gate insulator film and the diffusion layer, and a second well region of the first conductivity type formed between the second main terminal region and the diffusion layer. The second well region has a impurity concentration higher than that of the first well region.

Embodiments will now be explained with reference to the accompanying drawings.

(First Embodiment)

Figure 1:
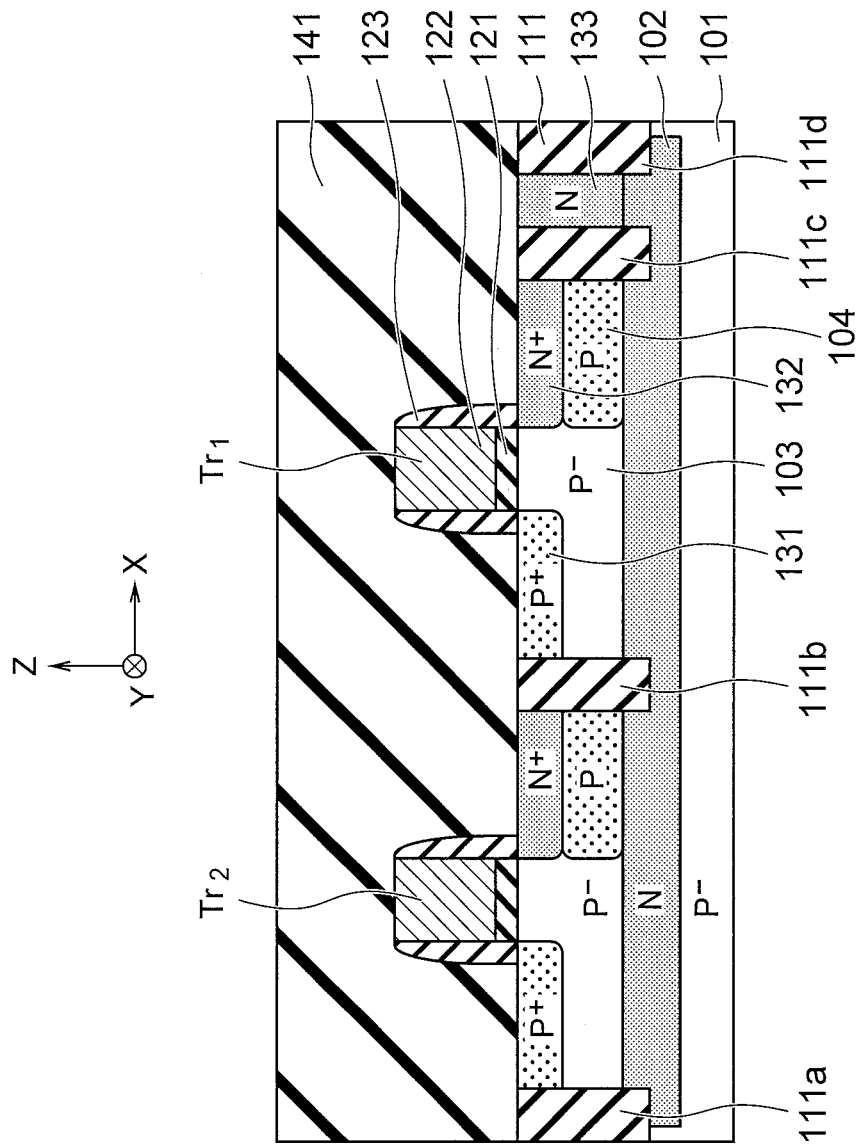
FIG. 1 is a cross-sectional view of a structure of a semiconductor device according to a first embodiment.

FIG. 1 is a cross-sectional view of a structure of a semiconductor device according to a first embodiment.

The semiconductor device in FIG. 1 includes a plurality of tunnel transistors. In FIG. 1, two tunnel transistors Tr1 and Tr2 are illustrated as examples of such transistors. Both the tunnel transistors Tr1 and Tr2 are n-type transistors.

As constituent elements and the like of these tunnel transistors Tr1 and Tr2, the semiconductor device in FIG. 1 includes a semiconductor substrate 101, a first diffusion layer 102, a first well region 103, a second well region 104, an element isolation insulator film 111, a gate insulator film 121, a gate electrode 122, a sidewall insulator film 123, a source region 131, a drain region 132, a second diffusion layer 133, an interlayer insulator film 141, and the like.

The semiconductor substrate 101 is, for example, a silicon substrate. In this embodiment, the semiconductor substrate 101 is a p-type substrate containing a low concentration of a p-type impurity. In FIG. 1, an X direction and a Y direction, which are parallel to a principal surface of the semiconductor substrate 101 and perpendicular to each other, and a Z direction, which is perpendicular to the principal surface of the semiconductor substrate 101, are illustrated. The X direction corresponds to a gate length direction of tunnel transistors Tr1 and Tr2, and the Y direction corresponds to a channel width direction of tunnel transistors Tr1 and Tr2.

Note that the semiconductor substrate 101 according to this embodiment is not a semiconductor substrate constituting an SOI substrate, but a bulk semiconductor substrate as illustrated in FIG. 1.

The element isolation insulator film 111 is formed inside the semiconductor substrate 101 so as to extend in the Y direction. The element isolation insulator film 111 is, for example, a silicon dioxide film. In the figure, the element isolation insulator films 111b and 111c, on right and left sides of the tunnel transistor Tr1, are examples of a first element isolation insulator film and a second element isolation insulator film, respectively. Similarly, an element isolation insulator film 111a and the element isolation insulator film 111b on the right and left sides of the tunnel transistor Tr2 are examples of a first element isolation insulator film and a second element isolation insulator film, respectively.

Each of the tunnel transistors Tr1 and Tr2 includes the gate insulator film 121, the gate electrode 122, the sidewall insulator film 123, the source region 131, and the drain region 132 as illustrated in FIG. 1.

The gate electrode 122 is formed on the semiconductor substrate 101 between the element isolation insulator films 111 through the gate insulator film 121. Furthermore, the sidewall insulator film 123 is formed on a lateral side of the gate electrode 122. The gate insulator film 121 is, for example, a silicon dioxide film, and the gate electrode 122 is, for example, a polysilicon layer. Furthermore, the sidewall insulator film 123 is, for example, a silicon dioxide film or a silicon nitride film.

The source region 131 and the drain region 132 are formed inside the semiconductor substrate 101 so as to sandwich the gate electrode 122. In this embodiment, the source region 131 is a p-type region, and the drain region 132 is an n-type region. The source region 131 and the drain region 132 are examples of a first main terminal region and a second main terminal region, respectively. Furthermore, a p conductivity type and an n conductivity type are examples of a first conductivity type and a second conductivity type, respectively.

The first diffusion layer 102 and the second diffusion layer 133 are formed inside the semiconductor substrate 101 as illustrated in FIG. 1.

The first diffusion layer 102 is formed so as to come in contact with four element isolation insulator films 111a to 111d in FIG. 1 and has an upper surface thereof in a position deeper than lower surfaces of the source region 131 and the drain region 132. Thus, in a lower part of the tunnel transistors Tr1 and Tr2, the first well region 103 and the second well region 104, which are electrically separated from a lower region of the first diffusion layer 102, are formed. In this embodiment, the first diffusion layer 102 is an n-type layer containing a low concentration of an n-type impurity.

The second diffusion layer 133 is formed in a position to connect a surface of the semiconductor substrate 101 and the first diffusion layer 102. In this embodiment, the second diffusion layer 133 is an n-type layer. Furthermore, the second diffusion layer 133 is formed between the element isolation insulator films 111. In the figure, the element isolation insulator film 111d, which is on a right side of the second diffusion layer 133, is an example of a third element isolation insulator film. In this embodiment, a width in the X direction between the second element isolation insulator film and the third element isolation insulator film is set to be narrower than a width in the X direction between the first element isolation insulator film and the second element isolation insulator film.

The interlayer insulator film 141 is formed on the semiconductor substrate 101 so as to cover the tunnel transistors Tr1 and Tr2. The interlayer insulator film 141 is, for example, a silicon dioxide film.

Beneath the tunnel transistors Tr1 and Tr2, there is provided a well region surrounded by the first diffusion layer 102 and the element isolation insulator films 111. This well region includes the first well region 103 and the second well region 104.

The second well region 104 is provided beneath the drain region (second main terminal region) 132. In other words, the second well region 104 is provided between the drain region 132 and the first diffusion layer 102. The second well region 104 covers a lower part of the drain region 132. The second well region 104 has a higher concentration of the p-type impurity than the first well region 103.

The first well region 103 is provided in a region where the second well region 104 is not provided within the well region. That is, beneath the source region (first main terminal region) 131 and beneath the gate insulator film 121. In other words, the first well region 103 is provided between the source region 131 and the gate insulator film 121, and the first diffusion layer 102. The first well region 103 includes the low concentration of the p-type impurity. The concentration of the p-type impurity of the first well region 103 is the same level as the concentration of the p-type impurity of the semiconductor substrate 101.

As described above, in this embodiment, the first diffusion layer 102 is formed inside the semiconductor substrate 101. Then, the first diffusion layer 102 is formed so as to come in contact with the element isolation insulator films 111a to 111c and has the upper surface thereof in the position deeper than the lower surfaces of the source region 131 and the drain region 132.

Thus, in this embodiment, the tunnel transistor Tr1 and the tunnel transistor Tr2 are electrically separated from each other by the element isolation insulator films 111a to 111c and the first diffusion layer 102. In this way, according to this embodiment, it is possible to electrically separate the tunnel transistors Tr1 and Tr2 formed on the bulk semiconductor substrate 101 from each other.

Figure 2:
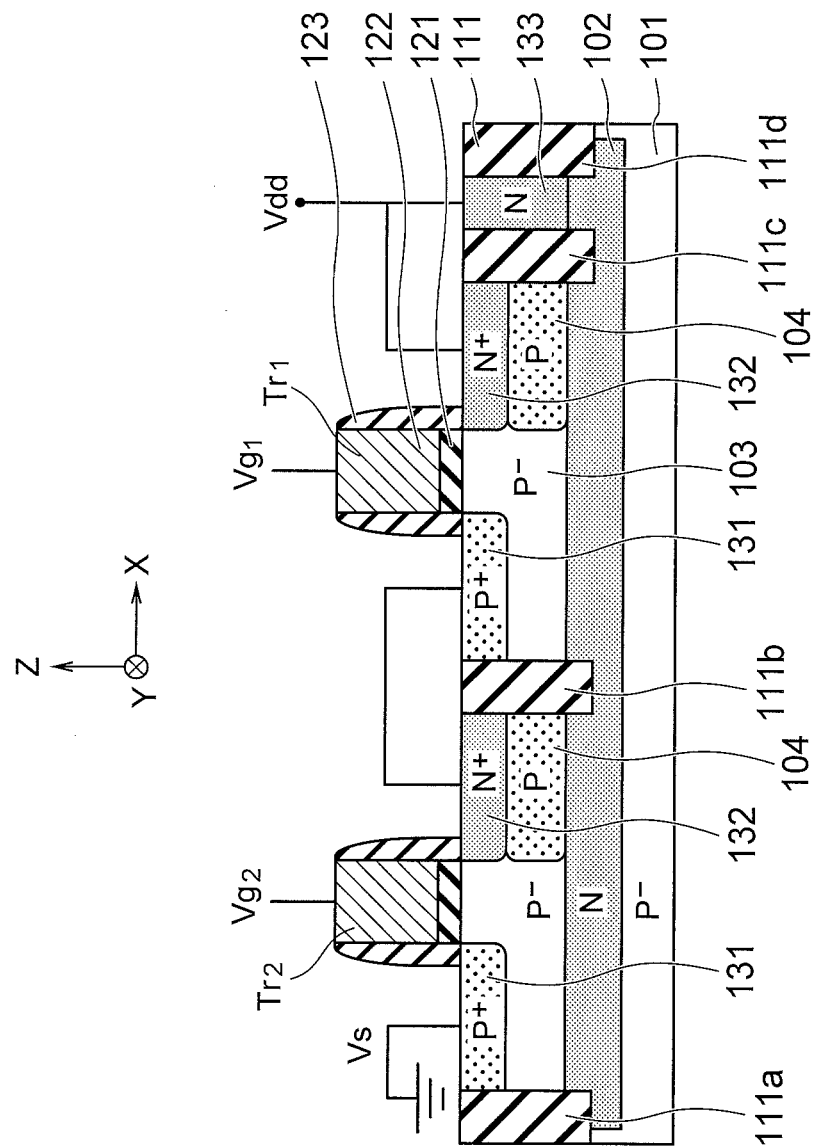
FIG. 2 is a cross-sectional view illustrating operation of the semiconductor device according to the first embodiment.

FIG. 2 is a cross-sectional view illustrating operation of the semiconductor device according to the first embodiment. The drain region 132 of the tunnel transistor Tr2 and the source region 131 of the tunnel transistor Tr1 are electrically connected by a wire. The drain region 132 and the second diffusion layer 133 of the tunnel transistor Tr1 are connected to a power supply voltage Vdd (>0), and the source region 131 of the tunnel transistor Tr1 is connected to a grounding voltage Vs (=0).

In a case where the second well region 104 is omitted from a configuration in FIG. 2, that is, where there is the first well region 103 containing a low concentration of the p-type impurity between the drain region 132 and the first diffusion layer 102, a punch through occurs between the drain region 132 and the first diffusion layer 102. This is because a limited space between the lower surface of the drain region 132 and the upper surface of the first diffusion layer 102, which is about 100 nm, considering the typical depth of the element isolation insulator films 111 and the depth of the drain region 132.

Therefore, in this embodiment, there is provided the second well region 104 containing a high concentration of the p-type impurity between the drain region 132 and the first diffusion layer 102. By this second well region 104, the punch through, which occurs between the drain region 132 and the first diffusion layer 102, can be restrained.

Note that in a case where the well region beneath the tunnel transistors Tr1 and Tr2 is entirely the second well region 104 containing the high concentration of the p-type impurity, the punch through, which occurs between the drain region 132 and the first diffusion layer 102, can be restrained, although a threshold voltage of the tunnel transistors Tr1 and Tr2 may be increased, and a leakage current (junction leakage current) may occur between the source region 131 and the drain region 132.

Therefore, in this embodiment, the second well region 104 containing the high concentration of the p-type impurity is provided beneath the drain region 132 (between the drain region 132 and the first diffusion layer 102), and another region (beneath the source region 131 and beneath the gate insulator film 121) becomes the first well region 103 containing a low concentration of the p-type impurity. As a result, it is possible to restrain an increase of the threshold voltage and an occurrence of the junction leakage current while restraining the punch through, which occurs between the drain region 132 and the first diffusion layer 102.

Next, a method of manufacturing the semiconductor device according to the first embodiment is described using FIGS. 3A to 3F.

Figure 3A:
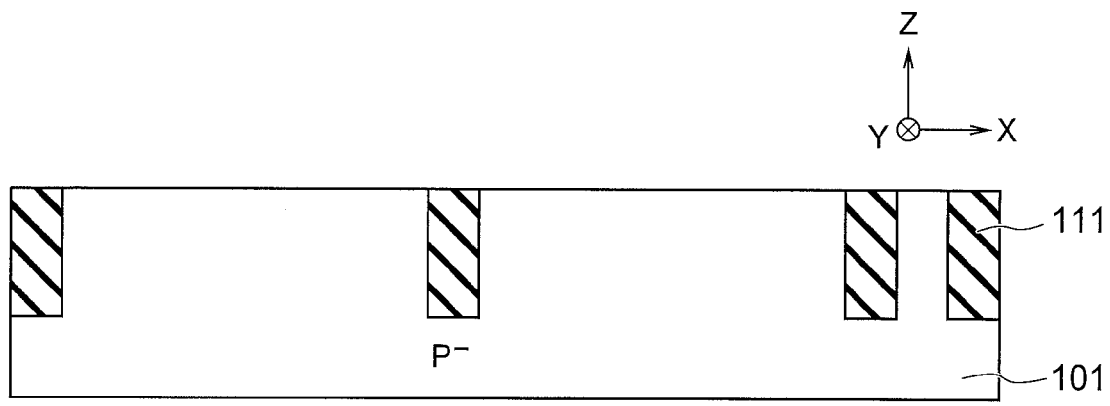
FIGS. 3A to 3F are cross-sectional process drawing illustrating a method of manufacturing the semiconductor device according to the first embodiment.

First, as illustrated in FIG. 3A, the element isolation insulator films 111 are formed inside the semiconductor substrate 101. The element isolation insulator films 111 can be formed by forming element isolation grooves inside the semiconductor substrate 101, by embedding insulator films in the element isolation grooves, and by flattening surfaces of the insulator films by the chemical mechanical polishing (CMP). The element isolation insulator films 111 according to this embodiment correspond to shallow trench isolation (STI) insulator films.

Figure 3B:
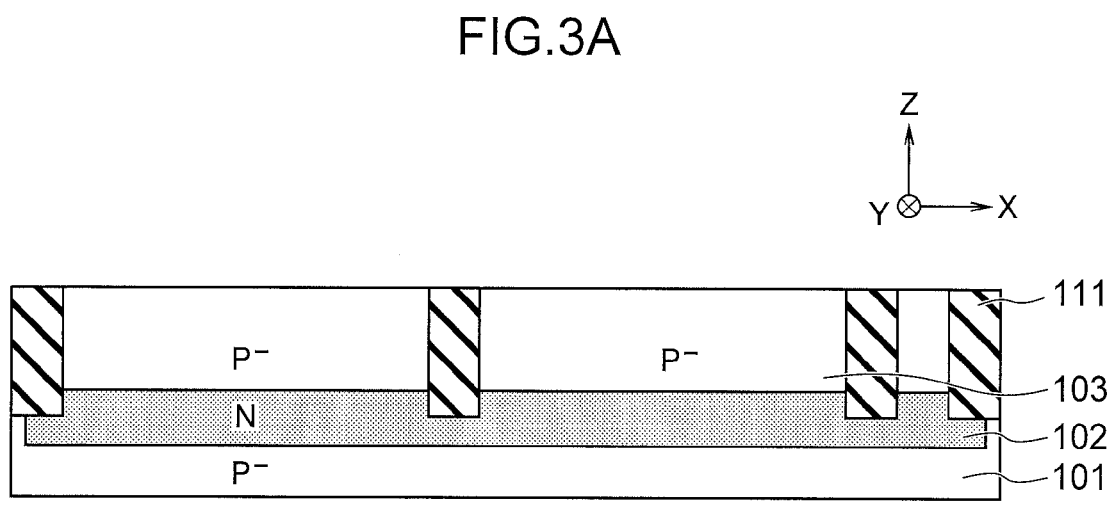

Next, as illustrated in FIG. 3B, an n-type layer to be the first diffusion layer 102 is formed inside the semiconductor substrate 101 by ion implantation. Phosphorus (P) and arsenic (As) are examples of the n-type impurity for this n-type layer.

In this embodiment, the first diffusion layer 102 is formed in a position to come in contact with bottoms of the four element isolation insulator films 111 in FIG. 3B. As a result, the first well regions 103 are formed between the element isolation insulator films 111. Furthermore, in this embodiment, the first diffusion layer 102 is formed at the depth not to come in contact with the source region 131 or the drain region 132, which are formed later.

Figure 3C:
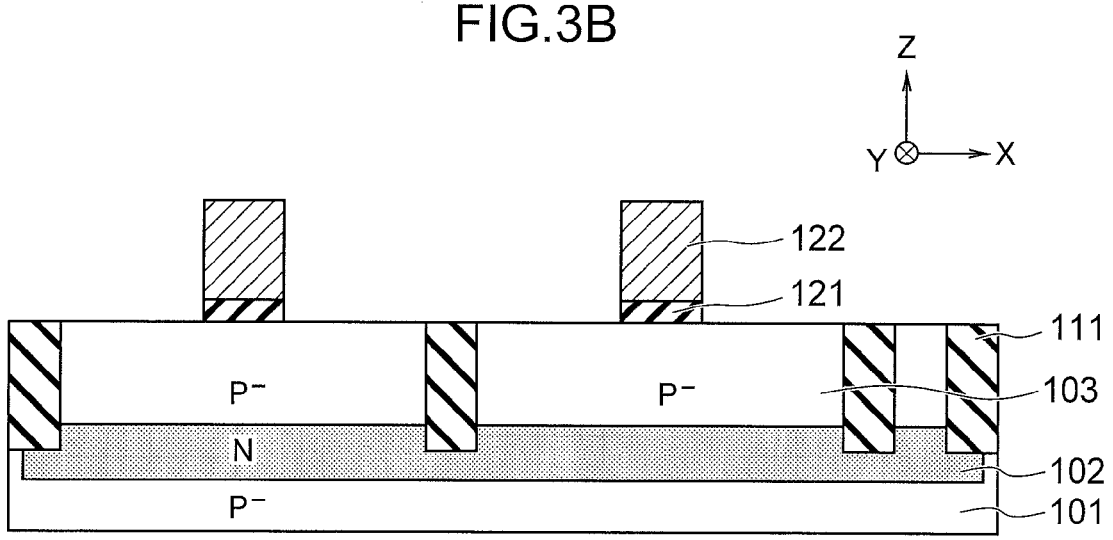

Next, as illustrated in FIG. 3C, the gate electrode 122 is formed on the semiconductor substrate 101 between the element isolation insulator films 111, through the gate insulator film 121. Furthermore, after the gate electrode 122 has been formed, a spacer layer, which is not illustrated, is formed. The gate electrode 122 can be formed by forming an insulator film to be the gate insulator film 121 on the semiconductor substrate 101, by forming an electrode material to be the gate electrode 122 on this insulator film, and by etching the electrode material by the reactive ion etching (RIE).

Figure 3D:
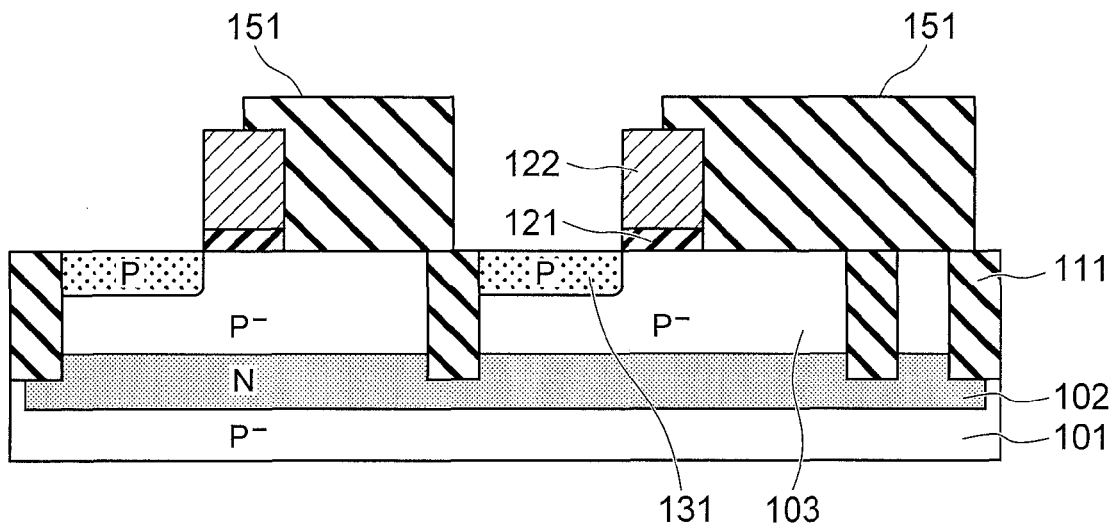

Next, as illustrated in FIG. 3D, a resist 151, which covers the drain region 132 and the second diffusion layer 133 to be formed later, is formed by a lithographic treatment. Then, a p-type layer to be the source region 131 is formed inside the semiconductor substrate 101 by the ion implantation. An ionic species used in this ion implantation is, for example, boron fluoride ($BF_2$) or boron (B).

After the source region 131 has been formed, the resist 151 is peeled off by thinner or the like.

Figure 3E:
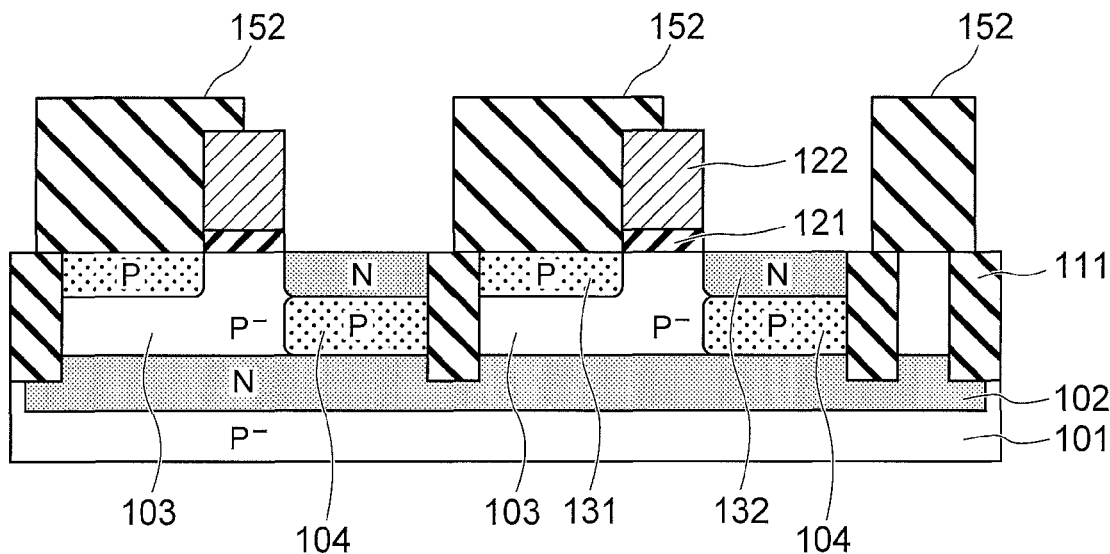

Next, as illustrated in FIG. 3E, a resist 152 for covering the source region 131 and the second diffusion layer 133, which is formed later, is formed by the lithographic treatment. Then, an n-type layer to be the drain region 132 and a p-type layer to be the second well region 104 are formed inside the semiconductor substrate 101 by the ion implantation. The ionic species used for forming the drain region 132 is, for example, phosphorus (P) or arsenic (As). Furthermore, the ionic species used for forming the second well region 104 is, for example, boron fluoride ($BF_2$) or boron (B).

The second well region 104 may be formed after forming of the drain region 132, or the second well region 104 may be formed before the forming of the drain region 132.

It is preferable that the second well region 104 completely cover the lower part of the drain region 132. Furthermore, it is preferable that the second well region 104 be provided at a distance from the source region 131.

In this way, by making only the second well region 104, which is between the drain region 132 and the first diffusion layer 102, an high-concentration p-type layer within the well region, it is possible to restrain the increase of the threshold voltage and the occurrence of the junction leakage current while restraining the punch through, which occurs between the drain region 132 and the first diffusion layer 102.

Figure 3F:
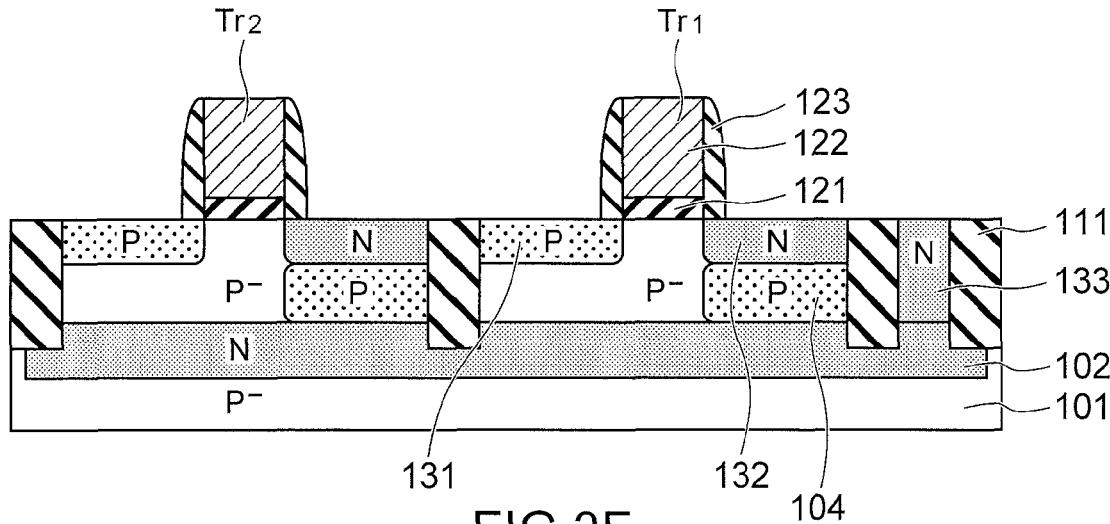

Next, as illustrated in FIG. 3F, by the lithographic treatment and the ion implantation, an n-type layer to be the second diffusion layer 133 is formed inside the semiconductor substrate 101. The ionic species used in this ion implantation is, for example, phosphorus (P) or arsenic (As). An accelerating voltage in the ion implantation is set to a value in which the second diffusion layer 133 reaches the first diffusion layer 102.

Subsequently, the sidewall insulator film 123 is formed on the lateral side of the gate electrode 122. Furthermore, various interlayer insulator films, a contact plug, a via plug, a wire layer, and the like are formed on the semiconductor substrate 101. In this way, the semiconductor device in FIG. 1 is manufactured.

As described above, in this embodiment, the first diffusion layer 102 is formed inside the semiconductor substrate 101 so as to come in contact with the element isolation insulator films 111a to 111c and has the upper surface in the position deeper than the lower surfaces of the source region 131 and the drain region 132.

Thus, in this embodiment, the tunnel transistor Tr1 and the tunnel transistor Tr2 are electrically separated from each other by the element isolation insulator films 111a to 111c and the first diffusion layer 102. In this way, in this embodiment, it is possible to electrically separate the tunnel transistors Tr1 and Tr2 formed on the bulk semiconductor substrate 101 from each other.

Furthermore, in this embodiment, the second well region 104 containing the high concentration of the p-type impurity is provided beneath the drain region 132 (between the drain region 132 and the first diffusion layer 102), and another region (beneath the source region 131 and beneath the gate insulator film 121) becomes the first well region 103 containing the low concentration of the p-type impurity.

Thus, in this embodiment, it is possible to restrain the increase of the threshold voltage of the tunnel transistors Tr1 and Tr2 and the occurrence of the junction leakage current while restraining the punch through, which occurs between the drain region 132 and the first diffusion layer 102.

(First Modification of the First Embodiment)

Figure 4:
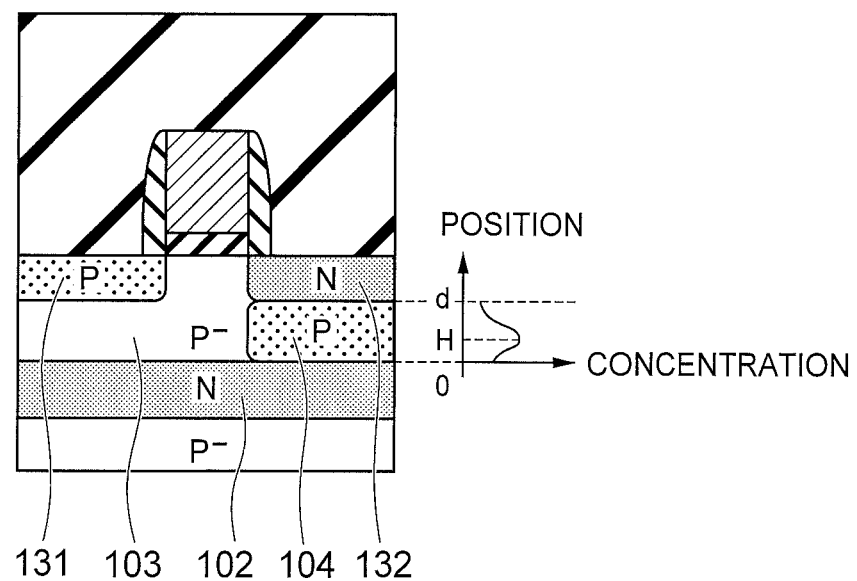
FIG. 4 is a view illustrating the semiconductor device according to a first modification of the first embodiment.

In the above-described first embodiment, the second well region 104 may have a concentration profile of the p-type impurity as illustrated in FIG. 4. As illustrated in FIG. 4, in the second well region 104, an impurity concentration is low near an interface between the drain region 132 and the second well region 104, and near an interface between the first diffusion layer 102 and the second well region 104, while the impurity concentration reaches a peak value at a position (height) H. When the thickness of the second well region 104 is d, and the interface between the first diffusion layer 102 and the second well region 104 is set as a reference point 0 of the position (height), the position H satisfies $0<p<d/2$.

That is, in the second well region 104, the impurity concentration is higher on a side of the first diffusion layer 102 than on a side of the drain region 132.

In this way, it is possible to further decrease the junction leakage current by making the peak value of the impurity concentration in the second well region 104 in a position away from the interface between the drain region 132 and the second well region 104 and by making the impurity concentration higher on the side of the first diffusion layer 102 than on the side of the drain region 132.

Such concentration profile of the p-type impurity of the second well region 104 can be realized by adjusting the accelerating voltage during the ion implantation for forming the p-type layer, which is to be the second well region 104, in a process illustrated in FIG. 3E.

(Second Modification of the First Embodiment)

Figure 5:
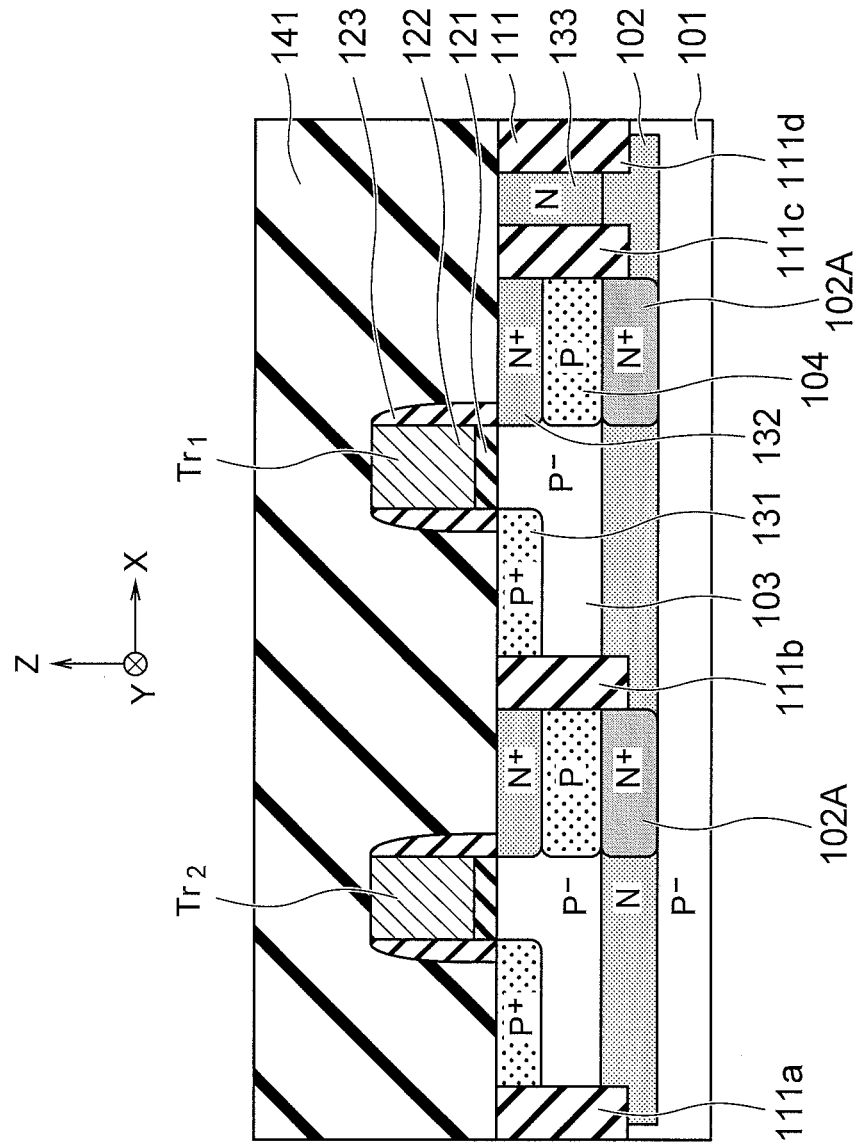
FIG. 5 is a cross-sectional view of the structure of the semiconductor device according to a second modification of the first embodiment.

In the above-described first embodiment, as illustrated in FIG. 5, in the first diffusion layer 102, a concentration of the n-type impurity of a lower part 102A of the second well region 104 may be higher than the concentration of the n-type impurity of another part of the first diffusion layer 102 (for example, a lower part of the first well region 103).

In this way, by making the concentration of the n-type impurity higher in the lower part 102A of the second well region 104 in the first diffusion layer 102, it is possible to prevent penetration of the p-type impurity in the second well region 104 and to electrically separate the tunnel transistor Tr1 and the tunnel transistor Tr2 more surely.

Such concentration profile of the p-type impurity of the second well region 104 can be formed, for example, in a process illustrated in FIG. 3E, by using the resist 152 as a mask and by performing the ion implantation of the n-type impurity into the first diffusion layer 102 region.

(Second Embodiment)

Figure 6:
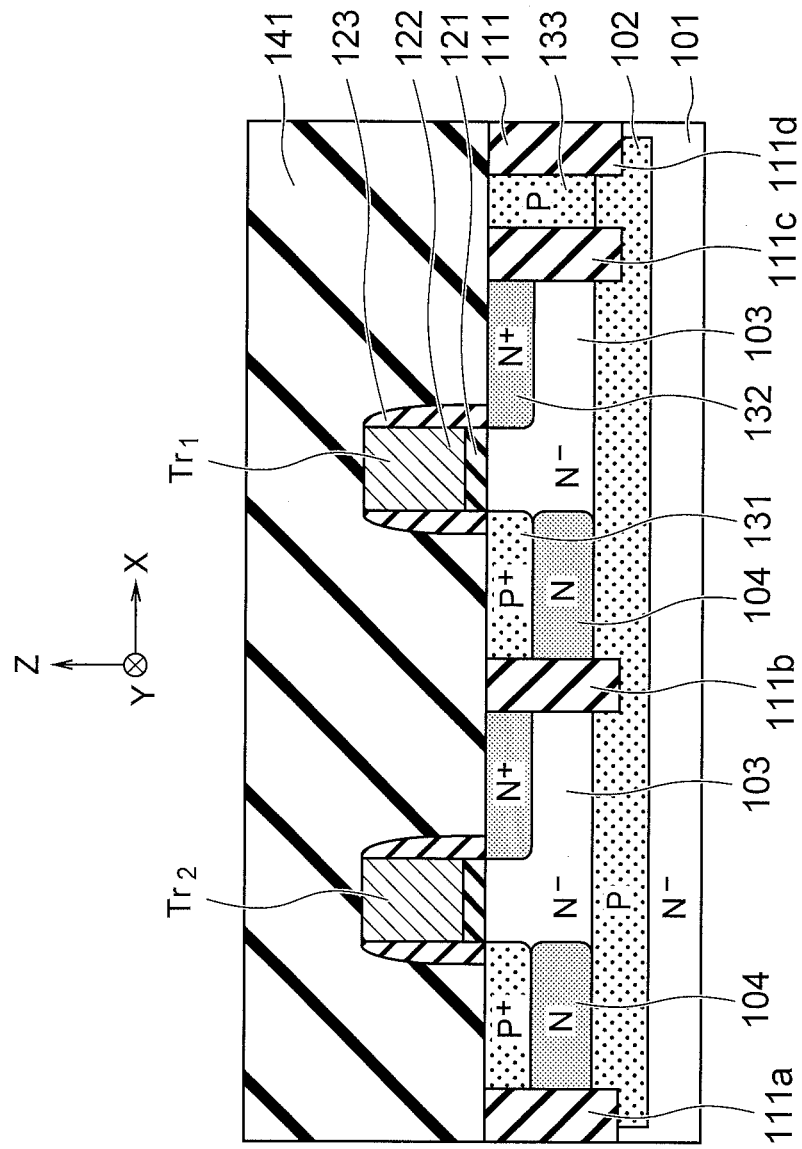
FIG. 6 is a cross-sectional view of a structure of a semiconductor device according to a second embodiment.

FIG. 6 is a cross-sectional view of a semiconductor device according to a second embodiment. Compared to the first embodiment in FIG. 1, this embodiment is different in that a semiconductor substrate 101 is an n-type substrate containing a low concentration of an n-type impurity, and in that a second well region 104 is provided between a source region 131 and a first diffusion layer 102. In FIG. 6, parts identical to those in the first embodiment in FIG. 1 are denoted with the same reference numerals, and descriptions thereof are omitted.

In this embodiment, both tunnel transistors Tr1 and Tr2 are n-type transistors. The first diffusion layer 102 and a second diffusion layer 133 are p-type layers. The tunnel transistor Tr1 and the tunnel transistor Tr2 are electrically separated from each other by element isolation insulator films 111a to 111c and the first diffusion layer 102.

Beneath the tunnel transistors Tr1 and Tr2, there is provided a well region surrounded by the first diffusion layer 102 and the element isolation insulator films 111. This well region includes a first well region 103 and the second well region 104.

The second well region 104 is provided beneath the source region 131. In other words, the second well region 104 is provided between the source region 131 and the first diffusion layer 102. The second well region 104 covers a lower part of the source region 131. The second well region 104 has a higher concentration of the n-type impurity than that of the first well region 103.

The first well region 103 is provided in a region where the second well region 104 is not provided within the well region. That is, beneath a drain region 132 and beneath a gate insulator film 121. In other words, the first well region 103 is provided between the drain region 132 and the gate insulator film 121, and the first diffusion layer 102. The first well region 103 includes a low concentration of the n-type impurity. The concentration of the n-type impurity of the first well region 103 is the same level as the concentration of the n-type impurity of the semiconductor substrate 101.

By the second well region 104 having the high concentration of the n-type impurity, it is possible to restrain a punch through, which occurs between the source region 131 and the first diffusion layer 102.

By performing ion implantation of the n-type impurity before or after forming of the source region 131, it is possible to form the second well region 104 positioned beneath the source region 131.

In the above-described second embodiment, in the first diffusion layer 102, a concentration of the p-type impurity of a lower part of the second well region 104 may be higher than the concentration of the p-type impurity of another part of the first diffusion layer 102 (for example, a lower part of the first well region 103). Furthermore, the concentration of the n-type impurity of the second well region 104 may be a concentration distribution similar to that in FIG. 4.

(Third Embodiment)

Figure 7:
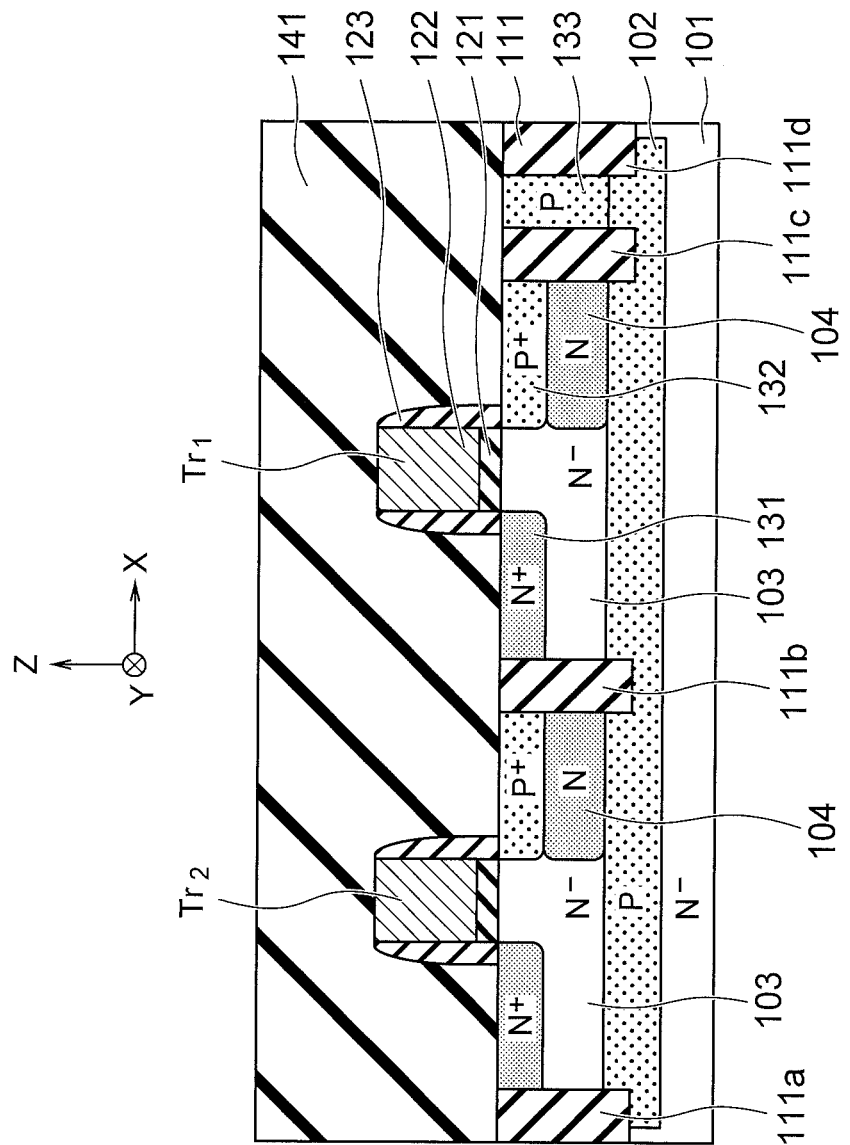
FIG. 7 is a cross-sectional view of a structure of a semiconductor device according to a third embodiment.

FIG. 7 is a cross-sectional view of a semiconductor device according to a third embodiment. Compared to the first embodiment in FIG. 1, this embodiment is different in that a semiconductor substrate 101 is an n-type substrate containing a low concentration of an n-type impurity, and in that both tunnel transistors Tr1 and Tr2 are p-type transistors. In FIG. 7, parts identical to those in the first embodiment in FIG. 1 are denoted with the same reference numerals, and descriptions thereof are omitted.

In this embodiment, a source region 131 is an n-type region, and a drain region 132 is a p-type region. Furthermore, a first diffusion layer 102 and a second diffusion layer 133 are p-type layers. The tunnel transistor Tr1 and the tunnel transistor Tr2 are electrically separated from each other by element isolation insulator films 111a to 111c and the first diffusion layer 102.

Beneath the tunnel transistors Tr1 and Tr2, there is provided a well region surrounded by the first diffusion layer 102 and the element isolation insulator films 111. This well region includes a first well region 103 and a second well region 104.

The second well region 104 is provided beneath the drain region 132. In other words, the second well region 104 is provided between the drain region 132 and the first diffusion layer 102. The second well region 104 covers a lower part of the drain region 132. The second well region 104 has a higher concentration of the n-type impurity than that of the first well region 103.

The first well region 103 is provided in a region where the second well region 104 is not provided within the well region. That is, beneath the source region 131 and beneath a gate insulator film 121. In other words, the first well region 103 is provided between the source region 131 and the gate insulator film 121, and the first diffusion layer 102. The first well region 103 includes a low concentration of the n-type impurity. The concentration of the n-type impurity of the first well region 103 is the same level as the concentration of the n-type impurity of the semiconductor substrate 101.

By the second well region 104 having the high concentration of the n-type impurity, it is possible to restrain a punch through, which occurs between the drain region 132 and the first diffusion layer 102.

In the above-described third embodiment, in the first diffusion layer 102, a concentration of the p-type impurity of a lower part of the second well region 104 may be higher than the concentration of the p-type impurity of another part of the first diffusion layer 102 (for example, a lower part of the first well region 103). Furthermore, the concentration of the n-type impurity of the second well region 104 may be a concentration distribution similar to that in FIG. 4.

(Fourth Embodiment)

Figure 8:
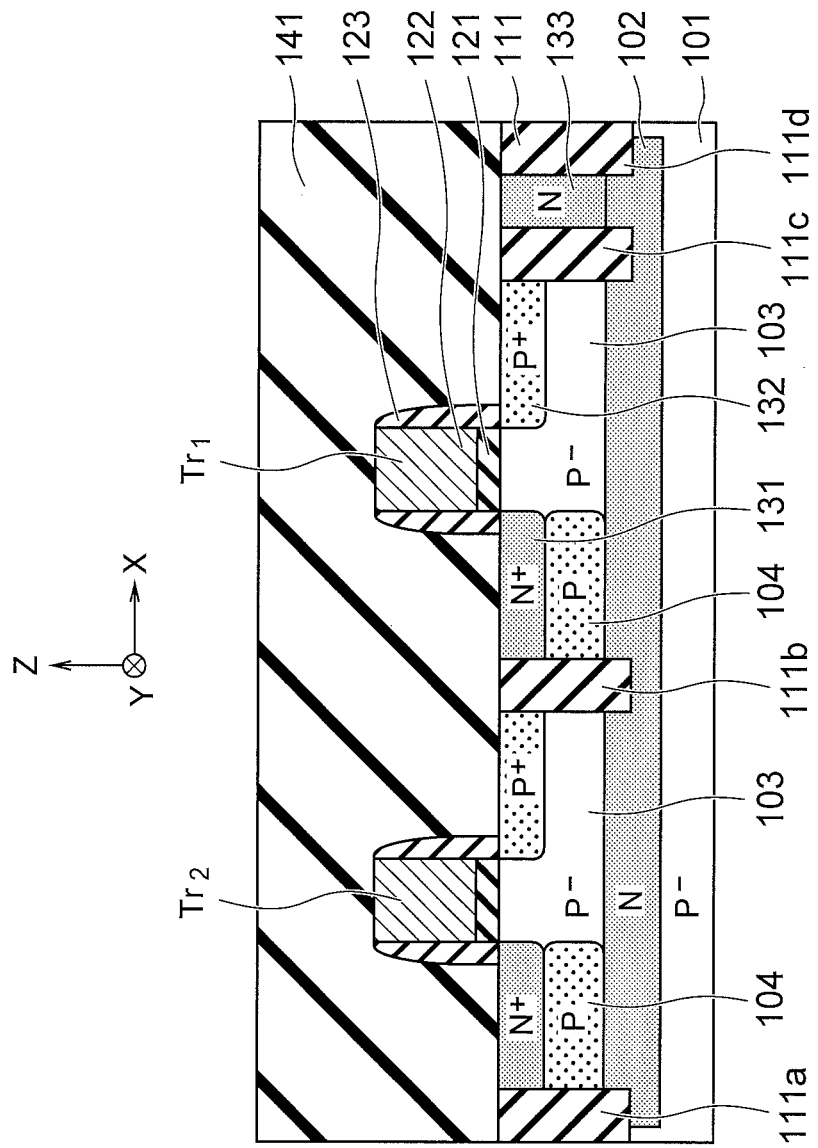
FIG. 8 is a cross-sectional view of a structure of a semiconductor device according to a fourth embodiment.

FIG. 8 is a cross-sectional view of a semiconductor device according to a fourth embodiment. Compared to the first embodiment in FIG. 1, this embodiment is different in that both tunnel transistors Tr1 and Tr2 are p-type transistors, and in that a second well region 104 is provided between a source region 131 and a first diffusion layer 102. In FIG. 8, parts identical to those in the first embodiment in FIG. 1 are denoted with the same reference numerals, and descriptions thereof are omitted.

In this embodiment, the source region 131 is an n-type region, and a drain region 132 is a p-type region. The tunnel transistor Tr1 and the tunnel transistor Tr2 are electrically separated from each other by element isolation insulator films 111a to 111c and the first diffusion layer 102.

Beneath the tunnel transistors Tr1 and Tr2, there is provided a well region surrounded by the first diffusion layer 102 and the element isolation insulator films 111. This well region includes a first well region 103 and the second well region 104.

The second well region 104 is provided beneath the source region 131. In other words, the second well region 104 is provided between the source region 131 and the first diffusion layer 102. The second well region 104 covers a lower part of the source region 131. The second well region 104 has a higher concentration of the p-type impurity than that of the first well region 103.

The first well region 103 is provided in a region where the second well region 104 is not provided within the well region. That is, beneath the drain region 132 and beneath a gate insulator film 121. In other words, the first well region 103 is provided between the drain region 132 and the gate insulator film 121, and the first diffusion layer 102. The first well region 103 includes a low concentration of the p-type impurity. The concentration of the p-type impurity of the first well region 103 is the same level as the concentration of the p-type impurity of the semiconductor substrate 101.

By the second well region 104 having the high concentration of the p-type impurity, it is possible to restrain a punch through, which occurs between the source region 131 and the first diffusion layer 102.

By performing ion implantation of the p-type impurity before or after forming of the source region 131, it is possible to form the second well region 104 positioned beneath the source region 131.

In the above fourth embodiment, in the first diffusion layer 102, a concentration of the n-type impurity of a lower part of the second well region 104 may be higher than the concentration of the n-type impurity of another part of the first diffusion layer 102 (for example, a lower part of the first well region 103). Furthermore, the concentration of the p-type impurity of the second well region 104 may be a concentration distribution similar to that in FIG. 4.

In the above-described first to fourth embodiments, cases where both of the tunnel transistors Tr1 and Tr2 are the n-type transistors or the p-type transistors have been described, but one of the tunnel transistors Tr1 and Tr2 may be the n-type transistor while the other may be the p-type transistor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor substrate;
    an element isolation insulator film formed inside the semiconductor substrate;
    a gate electrode formed on the semiconductor substrate with a gate insulator film therebetween;
    a first main terminal region of a first conductivity type and a second main terminal region of a second conductivity type, which is an opposite conductivity type of the first conductivity type, formed in the semiconductor substrate so as to sandwich the gate electrode;
    a diffusion layer of the second conductivity type formed in the semiconductor substrate so as to come in contact with the element isolation insulator film and having an upper surface at a position deeper than lower surfaces of the first and second main terminal regions;
    a first well region of the first conductivity type formed between the first main terminal region and the diffusion layer, and between the gate insulator film and the diffusion layer such that the diffusion layer is separated from the gate insulator film by the first well region interposed between the gate insulator film and the diffusion layer; and
    a second well region of the first conductivity type formed between the second main terminal region and the diffusion layer and having an impurity concentration higher than that of the first well region;
    wherein the semiconductor device is a tunnel transistor.

2. The semiconductor device according to claim 1, wherein the second well region covers a lower part of the second main terminal region.

3. The semiconductor device according to claim 1, wherein the impurity concentration is higher on a side of the diffusion layer than on a side of the second main terminal region in the second well region.

4. The semiconductor device according to claim 3, wherein a peak value of the impurity concentration comes to a part closer to the diffusion layer than the second main terminal region in the second well region.

5. The semiconductor device according to claim 1, wherein the impurity concentration is higher in a lower part of the second well region than in a lower part of the first well region in the diffusion layer.

6. The semiconductor device according to claim 1, wherein:
    the first main terminal region of the first conductivity type is a p-type source region, and
    the second main terminal region of the second conductivity type is an n-type drain region.

7. The semiconductor device according to claim 1, wherein:
    the first main terminal region of the first conductivity type is an n-type drain region, and
    the second main terminal region of the second conductivity type is a p-type source region.

8. The semiconductor device according to claim 1, wherein:
    the first main terminal region of the first conductivity type is an n-type source region, and
    the second main terminal region of the second conductivity type is a p-type drain region.

9. The semiconductor device according to claim 1, wherein:
    the first main terminal region of the first conductivity type is a p-type drain region, and
    the second main terminal region of the second conductivity type is an n-type source region.

10. The semiconductor device according to claim 1, wherein the semiconductor substrate is a bulk semiconductor substrate of the first conductivity type.

* * * * *